United States Patent
Bogner

(10) Patent No.: US 10,259,124 B2
(45) Date of Patent: Apr. 16, 2019

(54) SUCTION APPARATUS FOR AN END EFFECTOR, END EFFECTOR FOR HOLDING SUBSTRATES AND METHOD OF PRODUCING AN END EFFECTOR

(71) Applicant: SUSS MicroTec Lithography GmbH, Garching bei Muenchen (DE)

(72) Inventor: Bernhard Bogner, Garching bei Muenchen (DE)

(73) Assignee: SUSS MICROTEC LITHOGRAPHY GMBH (DE)

( * ) Notice: Subject to any disclaimer, the term of this patent is extended or adjusted under 35 U.S.C. 154(b) by 0 days.

(21) Appl. No.: 15/875,713

(22) Filed: Jan. 19, 2018

(65) Prior Publication Data

US 2018/0215049 A1    Aug. 2, 2018

(30) Foreign Application Priority Data

Jan. 27, 2017   (NL) ...................................... 2018243

(51) Int. Cl.
　　*B25J 15/06* (2006.01)
　　*H01L 21/683* (2006.01)
　　*H01L 21/687* (2006.01)

(52) U.S. Cl.
　　CPC ...... *B25J 15/0683* (2013.01); *H01L 21/6838* (2013.01); *H01L 21/68707* (2013.01); *Y10S 901/40* (2013.01)

(58) Field of Classification Search
　　CPC ................ B25J 11/0095; B25J 15/0616; B25J 15/0683; B25J 19/007; H01L 21/6838; H01L 21/68707; Y10S 901/40
　　USPC .................................. 294/213, 183, 188, 189
　　See application file for complete search history.

(56) References Cited

U.S. PATENT DOCUMENTS

| | | | | |
|---|---|---|---|---|
| 5,226,636 A | * | 7/1993 | Nenadic ................ | B25B 11/005 269/21 |
| 6,942,265 B1 | * | 9/2005 | Boyd ................ | H01L 21/67742 294/189 |
| 7,055,875 B2 | * | 6/2006 | Bonora ............... | H01L 21/6838 294/188 |
| 8,556,315 B2 | * | 10/2013 | Kampe ............... | H01L 21/6838 294/183 |
| 9,108,320 B2 | * | 8/2015 | Furuichi .............. | B25J 15/0616 |

(Continued)

FOREIGN PATENT DOCUMENTS

| | | | | |
|---|---|---|---|---|
| EP | 1593465 | 11/2005 | ............. | B25J 15/06 |
| JP | 2002184835 | 6/2002 | ............. | H01L 21/68 |
| JP | 2014176914 | 9/2014 | ............. | B25J 15/06 |

OTHER PUBLICATIONS

Netherlands Search Report (w/translation) ssued in application No. 2018243, dated Oct. 13, 2017 (10 pgs).

*Primary Examiner* — Dean J Kramer
(74) *Attorney, Agent, or Firm* — Hayes Soloway P.C.

(57) ABSTRACT

A suction apparatus for an end effector has a main body, which has a through-channel and a contact surface, and a sealing lip. The contact surface has an edge and recesses, wherein the through-channel issues into the recesses and the recesses terminate in front of the edge. The main body has a base portion and a fastening portion, which adjoins the base portion. In the fastening portion connection channels are provided which are in fluid communication with the through-channel and extend from the edge of the fastening portion. An end effector and a method of producing an end effector are also shown.

12 Claims, 2 Drawing Sheets

(56) References Cited

U.S. PATENT DOCUMENTS

| | | | |
|---|---|---|---|
| 2005/0110292 A1* | 5/2005 | Baumann | B25J 9/0012 294/188 |
| 2012/0235335 A1* | 9/2012 | Hayashi | H01L 21/6838 269/21 |
| 2015/0255322 A1 | 9/2015 | Ingram-Goble et al. | H01L 21/6838 |

* cited by examiner

SUCTION APPARATUS FOR AN END EFFECTOR, END EFFECTOR FOR HOLDING SUBSTRATES AND METHOD OF PRODUCING AN END EFFECTOR

FIELD OF THE DISCLOSURE

Embodiments of the present disclosure relate to a suction apparatus for an end effector for holding substrates, an end effector for holding substrates comprising a suction apparatus and a method of producing an end effector.

BACKGROUND

End effectors are the last element of a kinematic chain of transport apparatuses, e.g. robots. They are used e.g. for gripping or holding objects.

In the production of chips, end effectors are typically used for holding substrates, such as wafers, in order to move the substrates between different process stations.

Suction apparatuses for end effectors for the production of microchips are known and typically have a suction groove or a suction cup, e.g. a sealing lip fastened to the end effector. By means of a channel in the end effector, negative pressure can be produced within the suction cup or the suction groove, said negative pressure being able to be used for picking up flat objects, such as substrates or wafers.

During suction through a groove, the substrate lies in most cases directly on the end effector. This prevents the substrate from moving after it has been picked up. However, this is possible only in the case of substrates having particularly planar and smooth surfaces. Curved substrates cannot be fixed to the end effector in this manner.

A suction cup can be used to also hold curved substrates because they do not lie directly against the end effector. However, small movements of the substrate are still possible which can reduce the precision of the placement of the substrate. Moreover, by virtue of the comparatively large volume in the suction cup, it is not possible for the substrate to be released rapidly. For example, the release action is assisted by flushing the line or switching to excess pressure. Furthermore, this type of suction frequently leads to adhesion of the substrates on the suction cup, thus making the release thereof more difficult.

Moreover, when fixing substrates by means of conventional suction grooves or seals, a suction force acts locally upon the location of the suction groove or the seal which frequently have a particularly small diameter for maximising the suction force. Particularly thin and fragile substrates can be damaged as a result.

SUMMARY

Therefore, it is the object of the disclosure to provide a suction cup, an end effector and a method of producing an end effector, which permit precise positioning of the substrate. This also applies in particular to curved and particularly sensitive substrates.

The object is achieved by means of a suction apparatus for an end effector for holding substrates, comprising a main body which has a through-channel and a contact surface, and a sealing lip which surrounds the contact surface on the edge side, wherein the contact surface has an edge and at least one recess, in particular a suction groove, wherein the through-channel feeds into the at least one recess. The main body has a conical or cylindrical base portion, of which the end side constitutes the contact surface. The main body has a fastening portion which adjoins the base portion on the end side of the base portion facing away from the contact surface. In the fastening portion at least one connection channel is provided which is in fluid communication with the through-channel and extends from the edge of the fastening portion.

Preferably, the sealing lip also completely surrounds the contact surface on the edge side and alternatively or in additionally can be spaced apart from the edge.

Within the scope of this disclosure, substrates are understood also to be in particular wafers and substrates, such as semiconductor wafers, glass wafers, flexible substrates, wafers which produced synthetically from chips and casting compound (reconstituted wafers; moulded wafers with embedded dies) or substrates having 3-dimensional surfaces.

Although the apparatus referred to is a suction apparatus, it can also be a fixing apparatus which fixes substrates by means of excess pressure, thus utilizing the Bernoulli effect.

By means of the contact surface and the recesses provided on the contact surface, the substrate lies directly against the contact surface of the main body, closes the recess in a sealing manner and is therefore fixed at that location. Since the main body is rigid, it is no longer possible for the wafer to move with respect to the main body.

By virtue of the fact that, in the state of complete suction, the substrate closes the recesses in a sealing manner, the sealing lip no longer contributes to the holding force and is then also not evacuated further. Therefore, the pressure within the volume of the sealing lip can then be adapted to the ambient pressure, while the substrate is being held. As a result, the substrate is released more easily and precisely because the entire volume enclosed by the sealing lip no longer has to be flooded in order to release the substrate. Furthermore, in the state of complete suction, the negative pressure within the volume of the sealing lip can also be retained for a certain amount of time. The pressure which prevails within the volume of the sealing lip can depend upon the substrate. Further, the main body can be produced and assembled in a simple manner and the suction apparatus can be fastened in an end effector in a simple manner by means of the fastening portion. In addition, a channel extends through the entire main body for evacuation purposes.

The through-channel may be arranged concentrically in the base portion. The base portion can be in particular circular-cylindrical.

It is also feasible for the main body to be adhered to the end effector.

Moreover, the main body may be formed in one piece.

The directional indications used in this disclosure relate to the cylindrical or conical shape of the portions of the main body.

For example, the sealing lip is made of an elastic material, such as rubber or silicone. The main body can be rigid and is preferably produced from an electrically conductive material, such as high-grade steel or a conductive synthetic material. Therefore, electrostatic charges are avoided. Furthermore, the main body surface can be coated with a thin dissipative layer having a surface resistance of e.g. $10^5$ to $10^{11}$ ohm. This coating can have a thickness of up to 50 µm.

At least two recesses can be provided which are arranged in the shape of a cross. As a result, it is possible to increase the surface area within the main body which is exposed to the vacuum.

For example, the at least one recess terminates in front of the edge of the contact surface. Therefore, the recess does not penetrate the edge of the suction apparatus at any point. The recess is thus open only towards the contact surface and not also at the side. This ensures that the substrate closes the recess in a sealing manner when lying against it.

In order to simplify the production of the main body, starting from the through-channel the at least one recess can become flatter and in particular transition into the contact surface.

In one embodiment of the disclosure, the sealing lip is fastened to the base portion and extends as far as the contact surface or beyond a plane defined by the contact surface. This ensures that, on the one hand, the substrate can be picked up in a simple manner with the aid of the sealing lip and, on the other hand, simultaneously guarantees that the substrate ultimately lies against the contact surface after a slight deformation of the sealing lip.

Preferably, the base portion has, on its circumference, an annular groove in which the sealing lip is fastened. The sealing lip can be a disk having a concentric hole. This permits a simple construction of the suction apparatus.

For example, the function of the sealing lip can be improved if the annular groove extends obliquely with respect to a radial plane of the base portion. The angle between the radial plane and the annular groove can be greater than or equal to 5°.

The connection channel can be at least one groove in order to simplify the production of the fastening portion or the main body.

For example, a plurality of connection channels are provided which are arranged in a star-shaped manner so that when mounting the end effector a specific orientation of the suction apparatus does not have to be respected.

The object is also achieved by means of an end effector for holding substrates, comprising a carrier and at least one suction apparatus in accordance with the disclosure which is fastened to the main body.

In order to be able to fasten the main body of the suction apparatus in a secure manner to the end effector, the carrier can have a fastening opening, through which the base portion of the main body extends, wherein the fastening opening has a smaller diameter than the fastening portion, and wherein the fastening portion has a larger diameter than the base portion. In this manner, the main body of the suction apparatus can easily be fastened to the end effector.

Furthermore, the diameter of the fastening opening can also be larger than, or approximately the same size as, the diameter of the fastening portion. In this case, the fastening portion can be inserted and optionally adhered into fastening opening.

Preferably, the sealing lip is provided on the side of the fastening opening facing away from the fastening portion, wherein the suction apparatus is fixed in the fastening opening by means of the sealing lip and the fastening portion.

In the carrier at least one fluid channel, in particular a vacuum channel, is provided, wherein the at least one connection channel of the fastening portion is in fluid communication with the at least one fluid channel of the carrier, whereby negative pressure can be produced in the region of the recesses.

In one embodiment of the disclosure, the carrier has at least two layers, wherein the main body, in particular the fastening portion, is fastened between the two layers. As a result, the main body can be fastened securely to the carrier in a simple manner.

The object is also achieved by means of a method of producing an end effector, in particular an end effector in accordance with the disclosure, comprising the steps of:

a) providing a first layer of the end effector which has a fastening opening,
b) inserting the main body of the suction apparatus into the fastening opening from the first side of the first layer, and
c) fastening a second layer of the end effector to the first layer and/or the main body, in particular from the first side.

The first side is e.g. the topside of the first layer and of the carrier, i.e. the side on which the substrate is picked up under conditions of normal usage. In this way, the suction apparatus can be fastened to the carrier of the end effector in a simple and yet reliable manner.

Preferably, the sealing lip is fastened to the main body from a second side of the first layer opposite the first side so that the sealing lip also serves to fasten the suction apparatus to the carrier. The second side is e.g. the bottom side of the first layer or of the carrier.

DESCRIPTION OF THE DRAWINGS

Further features and advantages of the embodiments of the disclosure will be apparent from the following description and the enclosed drawings to which reference is made. In the drawings.

DETAILED DESCRIPTION

Figure 1:
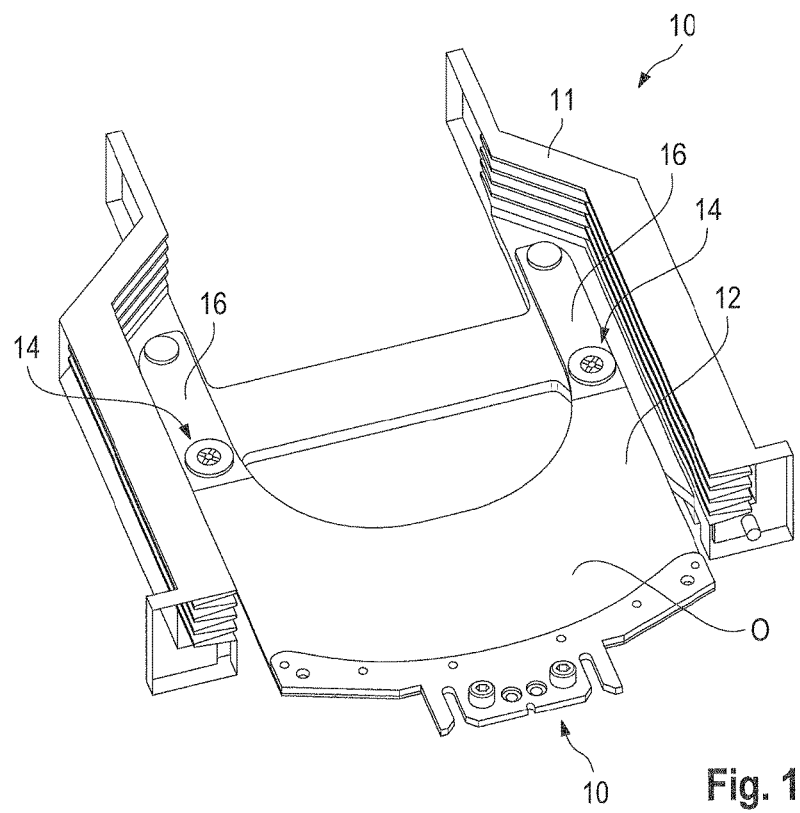
FIG. 1 shows a perspective view of an end effector in accordance with the disclosure comprising a suction apparatus in accordance with the disclosure, as well as a cartridge.

FIG. 1 illustrates an end effector 10 in an empty cartridge 11 for substrates. End effectors 10 are components of robots at the end of a kinematic chain.

The end effector 10 can be fastened to a robot arm (not shown) for moving substrates, e.g. wafers, and in the embodiment shown is a holder. However, it could also be a gripper.

The end effector 10 has a carrier 12 and two suction apparatuses 14 provided on the carrier 12.

For example, the carrier 12 has a cut-out, through which two holding arms 16 of the end effector 10 are formed, on which the suction apparatuses 14 are arranged.

Figure 2:
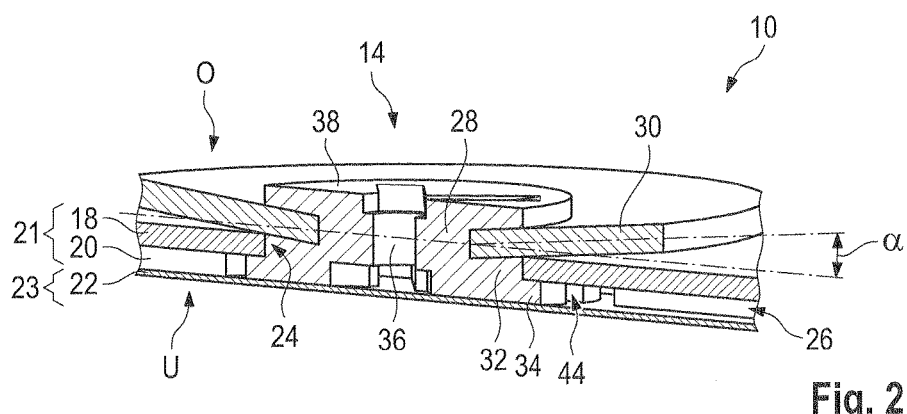
FIG. 2 shows a sectional view of the end effector of FIG. 1 in the region of one of the suction apparatuses in accordance with the disclosure.

In the sectional view shown in FIG. 2, it can be seen that the end effector 10 is constructed from a plurality of layers, namely a top layer 18 and a middle layer 20 which together form a first layer 21, and a bottom layer 22 which constitutes a second layer 23.

The bottom layer 22 is closed throughout and the top layer 18 is likewise almost closed except for two fastening openings 24 in which in each case one of the suction apparatuses 14 is inserted, and supply line bores in order to apply a vacuum to the suction apparatus or supply compressed air or gas thereto.

The middle layer 20 has a slot which extends and branches through the entire carrier 12, wherein the two branches terminate in the region of the fastening opening 24.

This slot is covered in a vertical direction by the top layer 18 and the bottom layer 20 so that in the carrier 12 a fluid channel 26 is formed which terminates in the region of fastening opening 24 and which in the embodiment shown is a vacuum channel.

The suction apparatus 14 is inserted in the fastening opening 24 on the carrier 12.

The suction apparatus 14 has a main body 28 and a sealing lip 30 which is fastened to the main body 28.

Figure 3:
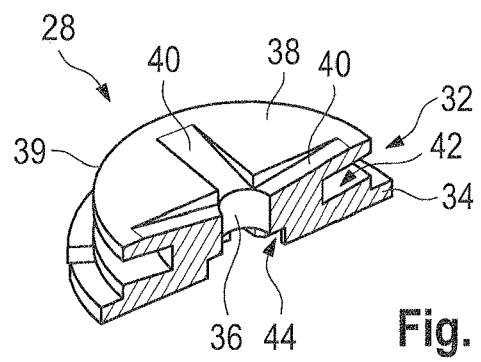
FIG. 3 shows a sectional view of a main body of a suction apparatus in accordance with the disclosure.
Figure 4:
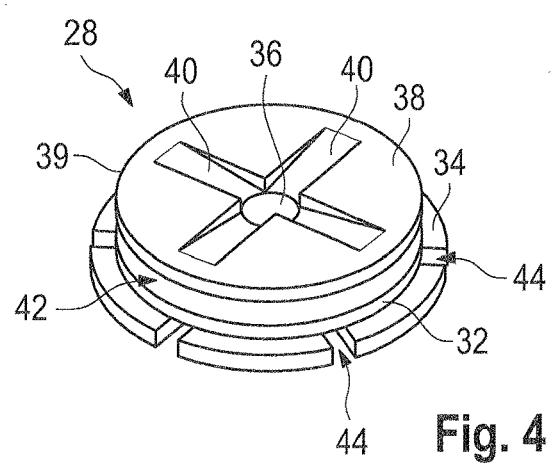
FIG. 4 shows a perspective view of the main body of FIG. 3.
Figure 5:
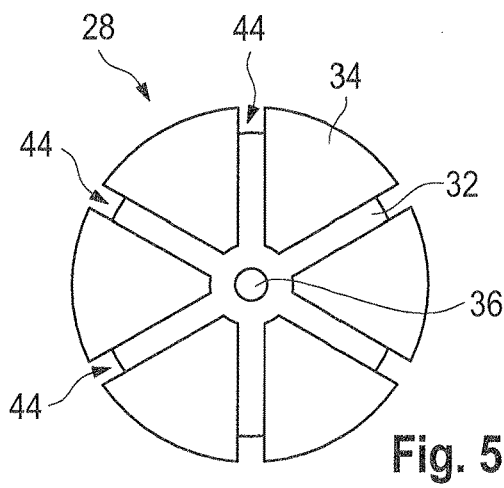
FIG. 5 shows a bottom view of the main body of FIG. 3.

FIGS. 3 to 5 illustrate the main body 28 of the suction apparatus 14 in detail but without the sealing lip 30.

The main body 28 has a base portion 32 and a fastening portion 34, wherein the base portion 32 adjoins the fastening portion 34.

The main body 28 is made of a rigid material. For example, high-grade steel or conductive synthetic material are suitable for this purpose. The material can be electrically conductive. The conductivity can be used in order to reduce electrostatic charge on the substrate or to avoid electric charging. Furthermore, the surface of the main body 28 can be coated with a thin dissipative layer having a surface resistance of e.g. $10^5$ to $10^{11}$ ohm.

The base portion 32 and the fastening portion 34 are formed in one piece.

Both the base portion 32 and the fastening portion 34 are arranged cylindrically, in particular circular-cylindrically and concentrically with respect to one another, wherein the fastening portion 34 has a larger diameter than the base portion 32.

It is also feasible for the base portion 32 and/or the fastening portion 34 to be formed in a conical manner.

A through-channel 36 extends concentrically in the axial direction through the main body 28, i.e. also through the base portion 32 and the fastening portion 34.

The base portion 32 has a contact surface 38 on its end side facing away from the fastening portion 34.

The contact surface 38 is defined on the circumference of the base portion 32 by an edge 39, and the through-channel 36 issues e.g. in the centre point of the contact surface 38.

In the contact surface 38 two recesses 40 are provided which form e.g. a cross and intersect each other in the centre point of the contact surface 38. Therefore, the through-channel 36 merges into the recesses 40 so that there is a fluid connection.

The recesses 40 extend in each case in the radial direction over the majority of the contact surface 38. However, the recesses 40 terminate with each of their ends in each case in front of the edge 39 of the contact surface 38.

The recesses 40 thus do not penetrate the edge 39 so that they are not open in the radial direction to the outer side of the main body.

The depth of the recesses 40 varies in the radial direction. The depth of the recesses 40 is at its greatest at the mouth of the through-channel 36. From this location, the depth decreases as the distance from the through-channel 36 increases until the recesses 40 ultimately transition into the contact surface 38.

Moreover, a circumferential annular groove 42 in which the sealing lip 30 can be fastened is provided on the circumference in the base portion 32 between the fastening portion 34 and the contact surface 38.

In the exemplified embodiment shown, the annular groove 42 forms with a radial plane an angle α which in this case is greater than or equal to 5°.

As can be clearly seen in FIG. 5, a plurality of connection channels 44 are provided in the fastening portion 34. In the embodiment shown, there are three connection channels 44.

The connection channels 44 are introduced into the fastening portion 34 as grooves, into which the through-channel 36 issues. Therefore, the connection channels 44 are in fluid communication with the through-channel 36 and thus also with the recesses 40.

In the exemplified embodiment shown, the connection channels 44 extend from the edge of the fastening portion 34 over the centre point of the fastening portion 34 to the opposite edge; they are arranged in a star-shaped manner.

If the suction apparatus 14 is fastened to the carrier 12, the base portion 32 extends through the fastening opening 24, as can be seen in FIG. 2. Then, the fastening portion 34 lies between the top, first layer 18 and the bottom, second layer 22 and can be clamped between these layers 18, 22. In the axial direction, the fastening portion 34 is thus located in the region of the middle layer 20.

For this purpose, the fastening opening 24 has a diameter which is slightly larger than the diameter of the base portion 32 but is smaller than the diameter of the fastening portion 34.

In other words, the larger diameter of the fastening portion 34 produces a step at the transition to the base portion 32 on which the top layer 18 lies.

Preferably, the thickness of the middle layer 20 corresponds substantially to the height of the fastening portion 34.

The fluid communication between the recesses 40 and the fluid channel 26 is effected via the fastening portion 34. The edge-side openings of the connection channels 44 are in fluid communication with the fluid channel 26 of the carrier 12. Therefore, fluid communication is established between the recesses 40 and the fluid channel 26 of the carrier 12 by means of the connection channels 44 and the through-channel 36.

The sealing lip 30 of the suction apparatus 14 is a disk having a concentric hole and is produced from an elastic material, such as rubber.

The sealing lip 30 is inserted into the annular groove 42 of the base portion 32 and extends on the topside O of the top layer 18 both in the radial direction and the axial direction to the contact surface 38.

Within the scope of the disclosure, the topside O is understood to be the side of the top layer 18 or of the end effector 10, against which the substrate is to lie under conditions of normal usage. The bottom side U is the side of the end effector 10 opposite thereto.

In the embodiment shown, the sealing lip 30 protrudes slightly over a plane which is defined by the contact surface 38. Its end remote from the base portion 32 is spaced apart from the edge 39.

Moreover, in order to improve the sealing action the sealing lip 30 is elastically pretensioned on topmost layer 18 of the carrier 12.

By means of the sealing lip 30 which lies from the topside O against the top, first layer 18, and by means of the fastening portion 34 which engages from the bottom side U against the top layer 18, the suction apparatus 14 is fixed to the carrier 12 in the fastening opening 24.

In order to hold or optionally grip substrates, a vacuum is applied to the recesses 40 via the fluid channel 26, the connection channels 44 and the through-channel 36, said vacuum being provided by a negative pressure source (not shown), e.g. a vacuum pump.

If the end effector 10 comprising the suction apparatuses 14 is then advanced from below or above close to a substrate (not shown), the sealing lip lies on the substrate. The applied vacuum causes the sealing space delimited by the sealing lip to be evacuated until the substrate (even with the aid of its intrinsic weight) deforms the sealing lip and lies against the contact surface 38.

From the moment when the substrate lies completely against the contact surface 38, the substrate seals the recesses 40 with respect to the sealing space of the sealing lip 30.

Then, the recesses 40 are evacuated further by the vacuum source and the substrate is thereby pressed more firmly against the contact surface 38. As a result, the substrate is fixed directly on the contact surface 38 in a secure and immovable manner.

The cross-shaped arrangement and the width of the recesses ensure that the vacuum acts uniformly over a large surface area.

However, at the same time there is no longer any fluid communication between the sealing space of the sealing lip 30 and the vacuum source so that the negative pressure in the sealing space is slowly reduced by ambient air which inevitably enters from outside. However, this does not have any influence upon the fixing of the substrate because the substrate is held directly on the contact surface 38 in a secure manner by the recesses 40.

If the substrate is then to be put down or released, the vacuum source is deactivated and the recesses 40 are ventilated with respect to the ambient pressure.

The small volume of the recesses 40 in comparison with the volume of the entire sealing space of the sealing lip 30 means that substantially less air must flow into the recesses 40 in order to equalise the pressure and thus release the substrate. As a result, the substrate is released more rapidly and more uniformly.

The production of the end effector 10 will be described hereinafter.

Firstly, the first layer 21 is provided at least partially.

The middle layer 20 can either already be fastened to the top layer 18 so that the first layer 21 is complete, or the middle layer 20 is fastened to the top layer 18 at a later point in time.

In the next step, the base portion 32 of the main body 28 without the sealing lip 30 inserted is guided from the bottom side U through the fastening opening 24 of the first layer 21.

Next or at a later point in time, the sealing lip 30 is then inserted into the annular groove 42 from the topside O and then protrudes from the fastening opening 24 towards the topside O.

Optionally, the middle layer 20 is then fastened to the top layer 18 in order to complete the first layer 21.

Subsequently, the bottom layer 22, i.e. the second layer 23, is fastened from the bottom side U to the first layer 21, more precisely to the middle layer 20. At the same time, the main body 28 is thereby also fastened to the carrier 12.

The different layers 18, 20, 22 are preferably adhered to one another. It is also possible to adhere the fastening portion 34.

The invention claimed is:

1. A suction apparatus for an end effector for holding substrates, comprising a main body which has a through-channel and a contact surface, and a sealing lip which surrounds the contact surface on an edge side, wherein the contact surface has an edge and at least one recess wherein the through-channel is connected with at least one recess,
    wherein the main body has a conical or cylindrical base portion, of which the end side constitutes the contact surface,
    wherein the main body has a fastening portion which adjoins the base portion on the end side of the base portion facing away from the contact surface,
    wherein in the fastening portion at least one connection channel is provided which is in fluid communication with the through-channel and extends from the edge of the fastening portion, and
    wherein starting from the through-channel the at least one recess becomes flatter and transitions into the contact surface.

2. The suction apparatus as claimed in claim 1, wherein the at least one recess terminates in front of the edge of the contact surface.

3. The suction apparatus as claimed in claim 1, wherein the sealing lip is fastened to the base portion and extends as far as the contact surface or beyond a plane defined by the contact surface.

4. The suction apparatus as claimed in claim 1, wherein the base portion has, on its circumference, an annular groove in which the sealing lip is fastened.

5. The suction apparatus as claimed in claim 4, wherein the annular groove extends obliquely with respect to a radial plane of the base portion.

6. An end effector for holding substrates, comprising a carrier which comprises a top layer and a bottom layer and at least one suction apparatus, which is fastened to the carrier, the at least one suction apparatus comprising a main body which has a through-channel and a contact surface, and a sealing lip which surrounds the contact surface on an edge side, wherein the contact surface has an edge and at least one recess wherein the through-channel is connected with at least one recess,
    wherein the main body has a conical or cylindrical base portion, of which the end side constitutes the contact surface,
    wherein the main body has a fastening portion which adjoins the base portion on the end side of the base portion facing away from the contact surface,
    wherein in the fastening portion at least one connection channel is provided which is in fluid communication with the through-channel and extends from the edge of the fastening portion, and
    wherein the fastening portion of the suction apparatus lies between the top layer and the bottom layer and is clamped between these layers.

7. The end effector as claimed in claim 6, wherein the carrier has a fastening opening, through which the base portion of the main body extends, wherein the fastening opening has a smaller diameter than the fastening portion, and wherein the fastening portion has a larger diameter than the base portion.

8. The end effector as claimed in claim 7, wherein the sealing lip is provided on the side of the fastening opening facing away from the fastening portion, wherein the suction apparatus is fixed in the fastening opening by means of the sealing lip and the fastening portion.

9. The end effector as claimed in claim 7, wherein in the carrier at least one fluid channel is provided, wherein the at least one connection channel of the fastening portion is in fluid communication with the at least one fluid channel of the carrier.

10. The end effector as claimed in claim 6, wherein the main body is fastened between the stop layer and the bottom layer.

11. A method of producing an end effector, comprising the steps of:
   a) providing a first layer of the end effector which has a fastening opening,
   b) inserting a fastening portion of a main body of a suction apparatus into the fastening opening from a first side of the first layer, and
   c) fastening a second layer of the end effector to at least one of the first layer and the main body, and
   d) forming a fluid channel between the first layer and the second layer defined by the first layer and the second layer wherein the fastening portion of the suction apparatus is clamped between the first layer and the second layer.

12. The method as claimed in claim 11, wherein a sealing lip is fastened to the main body from a second side of the first layer opposite the first side.

\* \* \* \* \*